(12) United States Patent
Venkata (10) Patent No.: US 9,299,406 B2
(45) Date of Patent: Mar. 29, 2016

(54) APPARATUSES AND METHODS FOR PROVIDING WORD LINE VOLTAGES DURING STANDBY

(75) Inventor: Harish N. Venkata, Allen, TX (US)

(73) Assignee: Micron Technology, Inc., Boise, ID (US)

(*) Notice: Subject to any disclaimer, the term of this patent is extended or adjusted under 35 U.S.C. 154(b) by 284 days.

(21) Appl. No.: 13/399,785

(22) Filed: Feb. 17, 2012

(65) Prior Publication Data
US 2013/0215701 A1  Aug. 22, 2013

(51) Int. Cl.
G11C 7/20 (2006.01)
G11C 7/00 (2006.01)
G11C 8/08 (2006.01)
G11C 8/14 (2006.01)

(52) U.S. Cl.
CPC .. *G11C 7/20* (2013.01); *G11C 7/00* (2013.01); *G11C 8/08* (2013.01); *G11C 8/14* (2013.01)

(58) Field of Classification Search
CPC ........... G11C 11/406; G11C 11/40615; G11C 2211/4061; G11C 11/40618; G11C 2211/4067; G11C 5/14; G11C 5/147; G11C 11/4074; G11C 11/417; G11C 7/22; G11C 7/20; G11C 7/00; G11C 8/14; G11C 8/08
USPC .......................... 365/222, 227, 230.06, 230.03
See application file for complete search history.

(56) References Cited

U.S. PATENT DOCUMENTS

| | | | |
|---|---|---|---|
| 7,139,208 B2 * | 11/2006 | Arimoto et al. | 365/222 |
| 7,245,548 B2 | 7/2007 | Derner et al. | |
| 7,359,271 B2 * | 4/2008 | Schneider et al. | 365/222 |
| 7,397,708 B2 * | 7/2008 | Oh | 365/189.011 |
| 7,538,599 B2 | 5/2009 | Valentian | |
| 7,691,710 B2 | 4/2010 | Mokhlesi et al. | |
| 8,004,048 B2 | 8/2011 | Yoo | |
| 2008/0031060 A1 * | 2/2008 | Choi et al. | 365/189.11 |
| 2008/0080296 A1 * | 4/2008 | Lee et al. | 365/230.06 |
| 2010/0085828 A1 * | 4/2010 | Parent | 365/226 |
| 2010/0202241 A1 * | 8/2010 | Park et al. | 365/230.06 |
| 2011/0199837 A1 * | 8/2011 | Reohr et al. | 365/189.06 |
| 2011/0235442 A1 * | 9/2011 | Campbell et al. | 365/189.11 |

* cited by examiner

*Primary Examiner* — Richard Elms
*Assistant Examiner* — Ajay Ojha
(74) *Attorney, Agent, or Firm* — Dorsey & Whitney LLP (57) ABSTRACT

Apparatuses and methods of providing word line voltages include an example apparatus including a voltage driver and a word line driver. The voltage driver is configured to provide a word line voltage, wherein the word line voltage is a pumped supply voltage responsive to an active mode and the word line voltage is a non-zero voltage less than the pumped supply voltage during a standby mode. The word line driver is coupled to the voltage driver and is configured to drive a respective word line to the word line voltage during the active and standby modes.

22 Claims, 9 Drawing Sheets

APPARATUSES AND METHODS FOR PROVIDING WORD LINE VOLTAGES DURING STANDBY

TECHNICAL FIELD

Embodiments of the invention relate generally to semiconductor memory, and more particularly in one or more of the illustrated embodiments, to providing word line voltages during a standby mode to reduce leakage currents.

BACKGROUND OF THE INVENTION

Memories typically include an array of memory cells arranged in rows and columns. Memory cells of each row are accessed by activating a corresponding access line often referred to as a word line. The word line may be activated by a word line driver responsive to decoding a corresponding row address with a row address decoder.

Word line drivers typically comprise a p-channel field effect transistor (pFET) and an n-channel field effect transistor (nFET) coupled together at their respective drains and gates, forming a complementary FET output stage coupled to the word line at the drains of the transistors. The source of the pFET can be configured to receive, for example, a phase signal (e.g., from a phase decoder). Meanwhile, the source of the nFET can be configured to receive, for example, a deactivated word line voltage (e.g., VNEGWL). Assuming a sufficiently high voltage phase signal (e.g., VCCP, which may be a pumped supply voltage) is provided as the phase signal to the source of its word line driver, a word line may be activated by providing a sufficiently low voltage (e.g., ground) to the gate of the pFET to turn on the pFET and pull the word line up to ~VCCP. To deactivate the word line (e.g., to close the row), as is typically desired after a row of memory cells has been accessed (e.g., refreshed), a sufficiently high voltage (e.g., VCCP) is provided to the gate of the nFET to quickly turn on the nFET and pull the word line down to ~VNEGWL.

A performance issue associated with the use of such a word line driver is gate-induced diode leakage (GIDL) current. GIDL currents may arise when the pFET of a word line driver experiences a relatively significant gate-to-source voltage such that current leaks from the n-well to the source of the pFET when the transistor is operating in an "off" state. Since the gates of the pFET and nFET transistors are coupled together in such a word line driver, this can occur when VCCP is being provided to the gate of the pFET (and thus also to the gate of the nFET) and ground is provided as the voltage for the phase signal, such as when the memory is in a standby mode. During the standby mode, the memory cells are not accessed and the operational state of the memory is such that power consumption is reduced. Because numerous word line drivers may be used simultaneously in a memory system, GIDL current can result in substantial unwanted power consumption, even during a standby mode for the memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
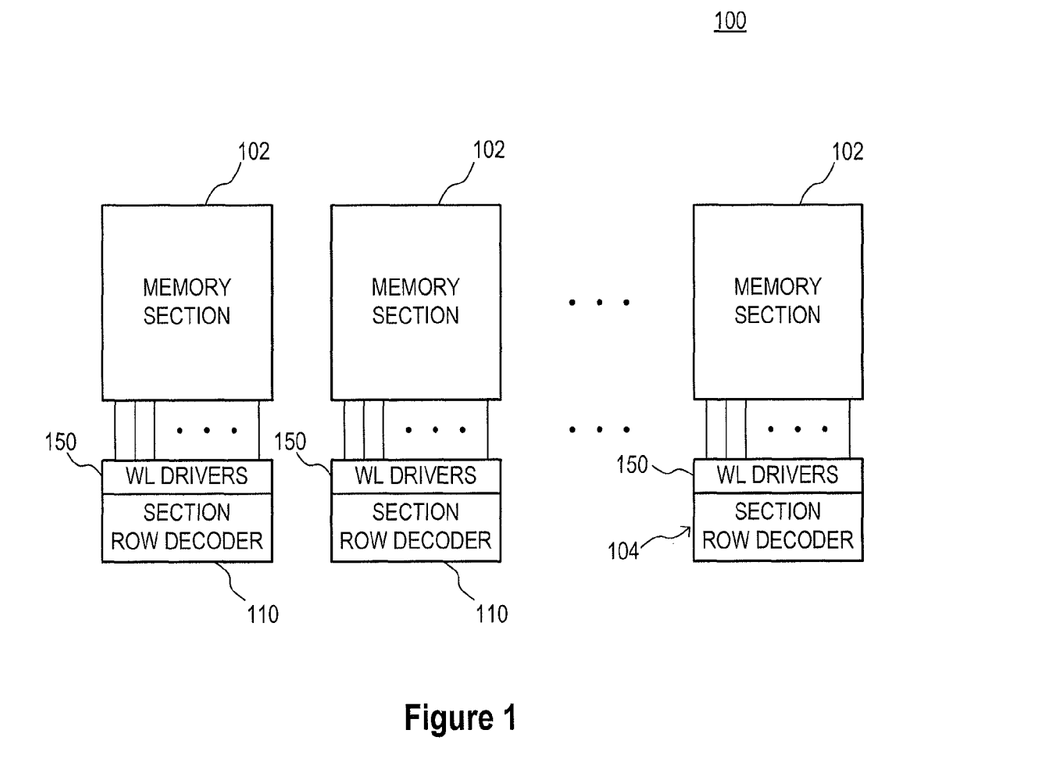
FIG. 1 is a block diagram of a memory bank according an embodiment of the invention.

FIG. 1 illustrates a block diagram for an apparatus in the form of a memory bank 100 according to an embodiment of the invention. The memory bank 100 may include a plurality of memory sections 102 that may include a plurality of rows of memory cells (not shown) that may be accessed by activating corresponding word lines (WLs). A respective section row decoder 110 and word line driver circuit 150 are coupled to the WLs of the corresponding memory section 102. In operation, data may be stored in the memory sections 102, with the section row decoders 110 and word line driver circuits 150 used during access. A memory in which the memory bank 100 is included may have a standby mode, during which the memory enters an operating state where the memory sections 102 are not accessed to reduce power consumption. In contrast, during an active mode, the memory is in an operating state where the memory sections 102 may be accessed, which results in greater power consumption.

Figure 2:
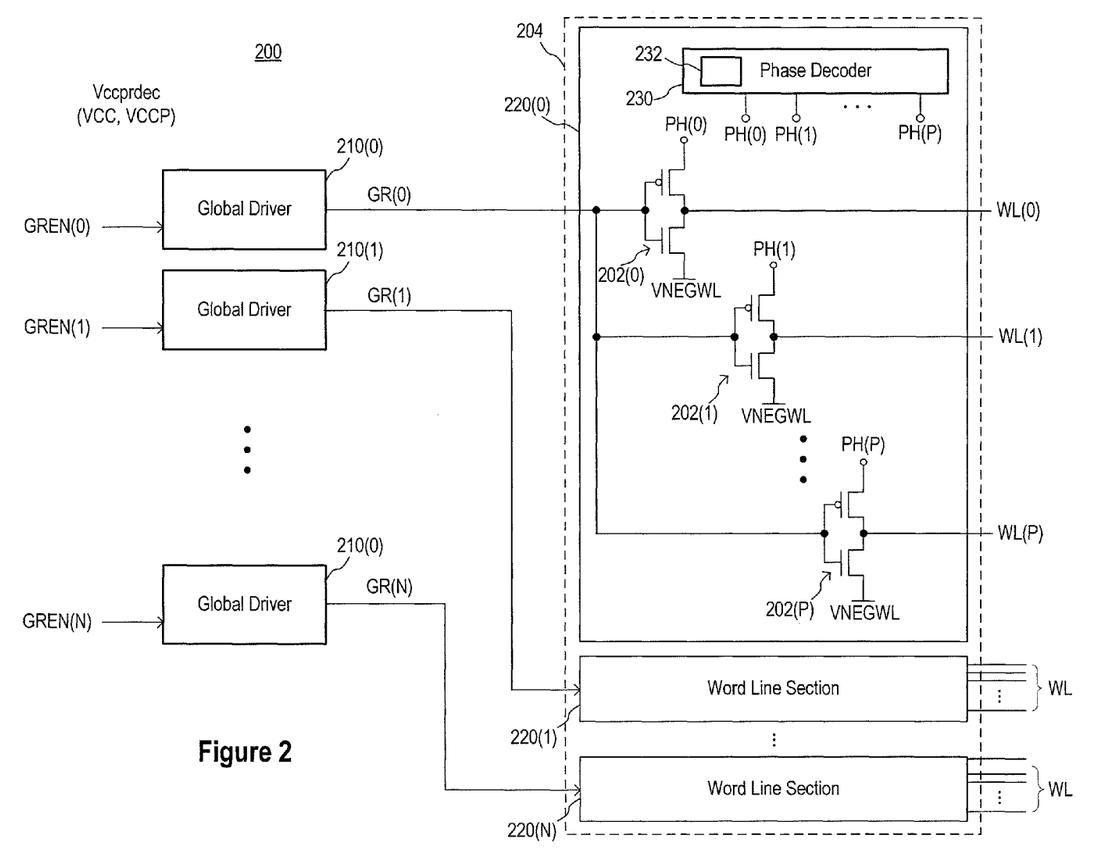
FIG. 2 is a schematic diagram of word line drivers according to an embodiment of the invention.

FIG. 2 illustrates a block diagram of portions of a decoder 200 and word line drivers 204 according to an embodiment of the invention. The decoder 200 and word line drivers 204 may be used for the section row decoders 110 and word line drivers 150 of FIG. 1. The decoder 200 includes global drivers 210(0)-210(N) coupled to word line sections 220(0)-220(N) of the word line drivers 204 of a memory section. Each of the word line sections 220 includes word line drivers 202(0)-202(P), each of which being coupled to a respective WL, and further includes a phase decoder 230 coupled to each of the word line drivers 202(0)-202(P) to provide a respective PH signal. The phase decoder 230 includes signal drivers 232 configured to provide the PH signals. Each of the global word line drivers 210(0)-210(N) provides word line drivers 202 of a respective word line section 220 a respective global row signal GR(0)-GR(N). A respective global row enable signal GREN(0)-GREN(N) is provided to each of the global drivers 210(0)-210(N) of a memory section.

Each word line driver 202 may include a p-channel field effect transistor (pFET) and a n-channel field effect transistor (nFET). The pFET and nFET are coupled at their respective drains to form an output stage coupled to a respective word line WL. Gates of the pFETs and nFETs of the word line drivers 202 of a word line section are configured to receive a GR signal from the respective global driver 210. The source of the pFET of each word line driver 202 is configured to receive a respective phase signal PH from the phase decoder 230, and the source of the nFET of each word line driver 202 is configured to receive a deactivated word line voltage VNEGWL (where a WL may be deactivated by coupling it to the VNEGWL voltage).

In operation, during a standby mode for the memory, inactive GREN signals are provided to the global drivers 210(0)-210(N)), thereby causing the GR signals to be at the VCCP voltage. As a result, the nFETs of the word line drivers 202 are conductive and the pFETs are not conductive, thereby coupling the WLs to the VNEGWL voltage. Also during standby mode for the memory, the phase decoder 230 provides PH signals having a non-zero voltage that is less the VCCP voltage of the GR signals. PH signals having this voltage reduces the gate-to-source voltage on the pFETs of the word line drivers 202, which may reduce GIDL current. During an active mode for the memory, a memory section 220 may be made active so that memory in the memory section may be accessed. The GR and PH signals are coordinated to drive selected word lines for accessing associated memory.

Figure 3:
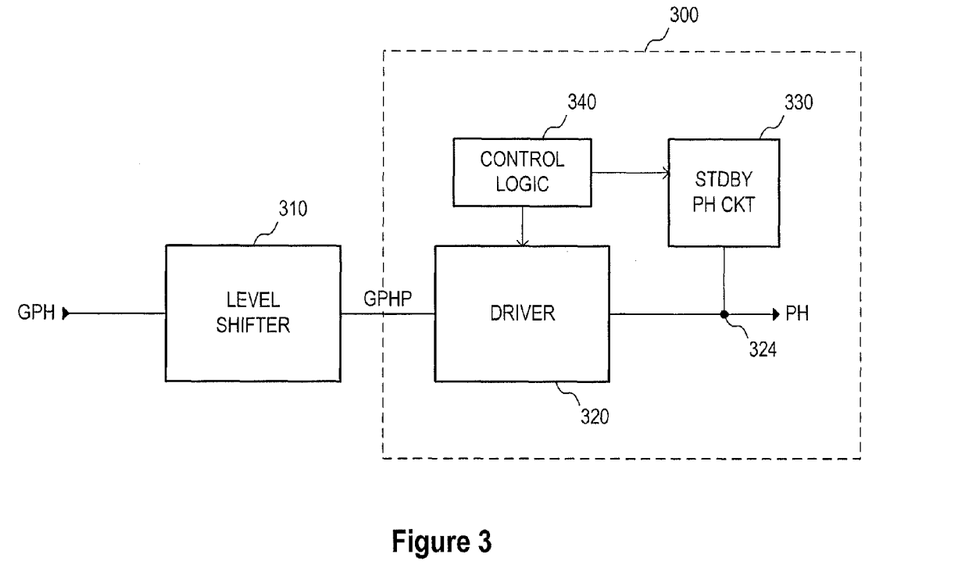
FIG. 3 is a block diagram of a signal driver according to an embodiment of the invention.

FIG. 3 illustrates a signal driver 300 according to an embodiment of the invention. The signal driver 300 may be used to provide a phase signal PH, for example, for a memory section phase decoder, for example, as a signal driver 232 included in phase decoder 230 of FIG. 2. A level shifter 310 is coupled to the signal driver 300 to provide an output signal GPHP responsive to an input signal GPH. The GPH signal and resulting GPHP signal may be used to control the voltage driver 300 to provide the PH signal. The GPH signal may have a first set of voltage levels corresponding to different logic levels and the GPHP signal provided by the level shifter 310 may have a second set of voltage levels corresponding to the different logic levels. For example, the voltage levels for GPH maybe between a reference voltage and a first supply voltage corresponding respectively to logic low and logic high levels, and the voltage levels for GPHP may be between the reference voltage and a second supply voltage corresponding respectively to logic low and logic high levels. In some embodiments, the reference voltage may be ground, the first supply voltage may be VCC, and the second supply voltage may be VCCP, which may be a pumped voltage greater than VCC. Examples of VCC and VCCP are approximately 1.2 volts for VCC and approximately 3.2 volts for VCCP, however, other values may be used as well.

The signal driver 300 includes a driver circuit 320 that provides a word line voltage PH responsive to the GPHP signal from the level shifter 310. The driver circuit 320 is configured to provide the PH signal at a node 324 having a third set of voltage levels. The third set of voltage levels may be the same as the second set of logic levels for the GPHP signal. For example, the third set of voltage levels may have ground for logic low and VCCP for logic high. A standby PH circuit 330 is coupled to the node 324 and control logic 340 is coupled to the standby PH circuit 330 and the driver circuit 320 to provide control signals during operation. As will be described in more detail below, the standby PH circuit 330 couples the node 324 to a standby PH voltage during a standby mode thereby providing a PH signal having the standby PH voltage. In some embodiments, the standby PH voltage is VCC. By coupling the node 324 to the standby PH voltage, for example, in contrast to providing a standby PH voltage equal to ground as conventionally done, as previously discussed, the gate-source voltage of the pull-up transistor of a word line driver (e.g., word line drivers of FIG. 2) may be reduced. As a result, the GIDL current may be reduced.

Figure 4:
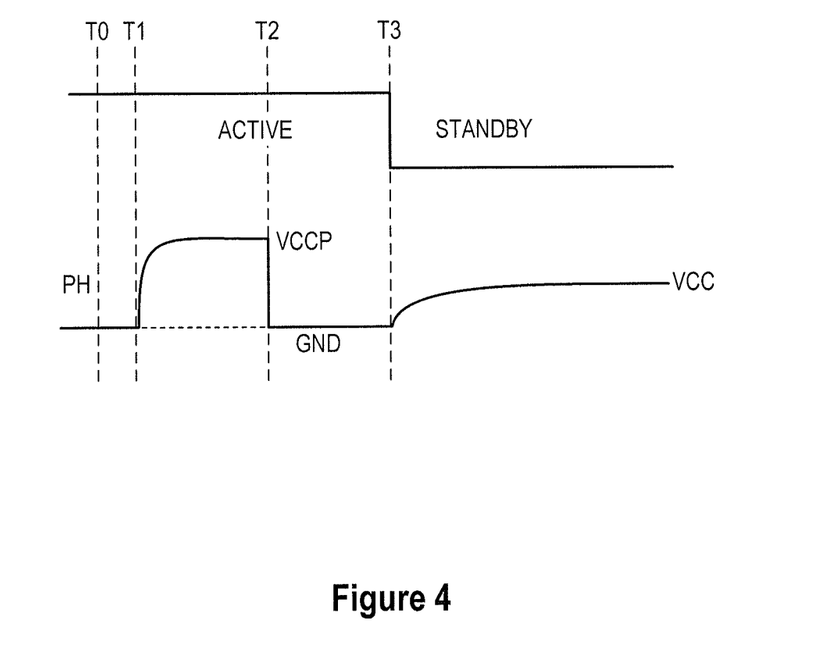
FIG. 4 is a timing diagram of various signals during operation of the apparatus of Figure A.

FIG. 4 illustrates a timing diagram for various signals during operation of the signal driver 300. At time T0 a memory is in an active mode, during which the PH signal may have a voltage of VCCP, such as between times T1 and T2, and may have a voltage of ground, such as between times T2 and T3. The VCCP voltage may be provided for activating word lines and ground may be provided for inactive word lines. At time T3, the memory enters a standby mode. As illustrated in FIG. 4, rather than providing a PH signal having a voltage of ground, the PH signal provided has a non-zero voltage less than the VCCP voltage, for example, VCC. It will be appreciated that the timing diagram of FIG. 4 has been provided for illustrative purposes, and the particular timing and voltages illustrated are not intended to limit the scope of the invention to the particular embodiment described.

Figure 5:
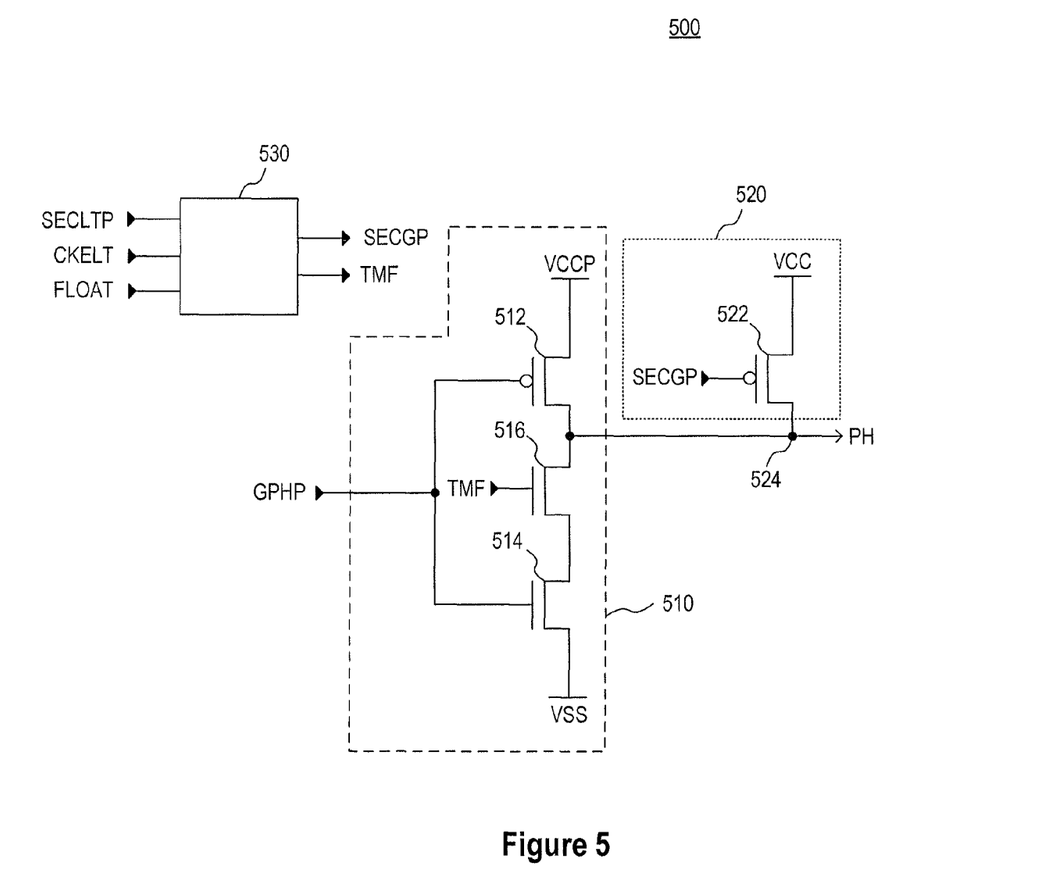
FIG. 5 is a schematic and block diagram of an apparatus according to an embodiment of the invention.

FIG. 5 illustrates an apparatus 500 according to an embodiment of the invention. The apparatus 500 includes a driver circuit 510, a standby PH circuit 520, and control logic 530. The driver circuit 510 includes a transistor 512 coupled to a node 524 and configured to receive a first supply voltage. In FIG. 5, the first supply voltage is provided by a first power supply providing a pumped supply voltage VCCP. The driver circuit 510 further includes a transistor 514 configured to receive a reference voltage, for example, VSS. The VSS may be various voltages, for example, the VSS may be ground a positive voltage, a negative voltage, or different voltages depending on the operation. A transistor 516 is coupled to the node 524 and the transistor 514. Gates of the transistor 512 and 514 are configured to receive a GPHP signal, for example, from a level shifter 310 (FIG. 3). A gate of transistor 516 is configured to receive a control signal TMF. The transistors 512 and 514 are configured to selectively couple the first supply voltage or the reference voltage to the node 524 responsive to the GPHP signal when the transistor 516 is conductive. The transistor 516 may decouple the node 524 from the reference voltage responsive to the TMF signal. The transistor 512 is illustrated in FIG. 5 as a p-channel field-effect transistor (pFET) and the transistors 514, 516 are illustrated as n-channel field-effect transistors (nFET). Other transistors of different types and/or configurations may be used as well without departing from the scope of the invention.

The standby PH circuit 520 includes a transistor 522 coupled to the node 524 and configured to receive a second supply voltage. In FIG. 5, the second supply voltage is provided by a second power supply providing a supply voltage VCC. A gate of transistor 522 is configured to receive a control signal SECGP. The transistor 522 is configured to selectively couple the second supply voltage to the node 524 as responsive to the SECGP signal. The transistor 522 is illustrated in FIG. 5 as a pFET. In other embodiments, the standby PH circuit 520 may include other circuits for coupling the second supply voltage to the node 524. The control logic 530 is configured to receive various control signals SECLTP, CKELT, and FLOAT, and provide the SECGP and TMF signals responsive to the control signals. The CKELT signal is indicative of an active/standby mode of the memory. The SECLTP signal is indicative of an active/inactive state of a memory section to which the PH signal is provided. In some embodiments, while a memory is in a standby mode a memory section may be in the inactive state or may be in the active state. The FLOAT signal is typically at a logic low when power is provided to the device in which the apparatus 500 is included.

In operation, during an active mode of the memory, and for an active memory section, the SECLTP and CKELT signals are at logic high, and the FLOAT signal is at logic low. The control logic 530 provides the SECGP and TMF signals having logic high levels. As a result, the transistor 522 is not conductive and the transistor 516 is conductive. The PH signal will have a voltage based on the logic level of the GPHP signal. That is, the PH signal will be at VCCP responsive to a logic low GPHP signal and the PH signal will be at VSS responsive to a logic high GPHP signal. In contrast to an active mode, during standby mode of the memory, and for inactive memory sections, the SECLTP and CKELT are at logic low, and the FLOAT signal is at logic low as well. The control logic 530 provides the SECGP and TMF signals having logic low levels. The GPHP signal is at logic high during the standby mode and inactive state, thereby controlling the transistor 512 to not be conductive. As a result, although the transistor 514 is conductive due to the logic high GPHP signal, the node 524 is decoupled from VCCP and VSS. The node 524, however, is coupled through the transistor 522 to VCC, thereby providing a PH signal having a VCC voltage.

As previously discussed, increasing the voltage of the PH signal from ground may reduce the gate-source voltage VGS of the pull-up transistors of word line drivers. That is, the GRF signal is typically at a VCCP voltage for a standby mode and inactive state as previously described. The resulting VGS for the pull-up transistors of the word line drivers with a PH signal of VCC is VCCP-VCC, which is less than with a PH signal at ground. GIDL currents resulting from the VGS of the pull-up transistors may be reduced due to the reduced VGS, thereby reducing power consumption.

Figure 6:
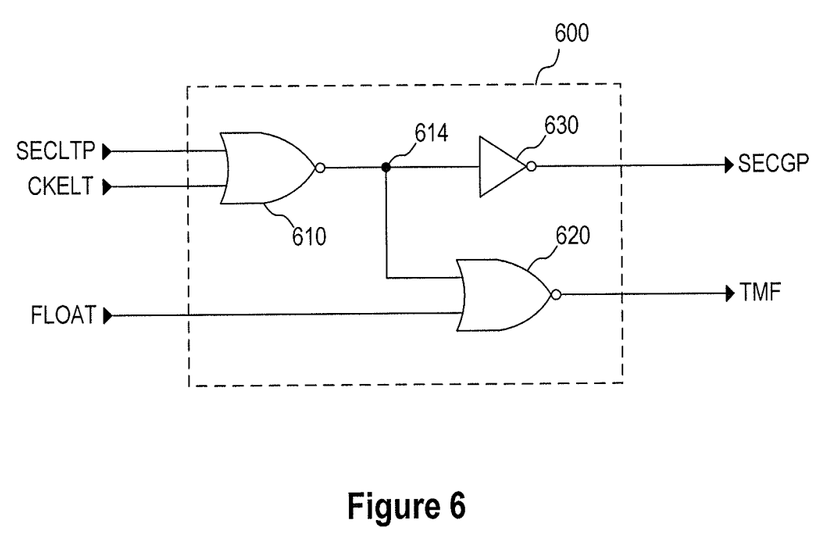
FIG. 6 is a schematic diagram of control logic according to an embodiment of the invention.

FIG. 6 illustrates control logic 600 according to an embodiment of the invention. The control logic 600 may be used for the control logic 530 of FIG. 5 to provide the SECGP and TMF signals. The control logic 600 includes NOR logic 610 and 620, and an inverter 630. In operation, during an active mode of the memory, and for an active memory section, the SECLTP and CKELT signals are at logic high, and the FLOAT signal is at logic low. The NOR logic 610 provides a logic low to node 614. Similarly, the NOR logic 610 provides a logic low to the node 614 during an active mode of the memory for inactive memory sections (i.e., CKELT is at logic high and SECLTP is at logic low). As a result, the NOR logic 620 provides a logic high TMF signal and the inverter 630 provides a logic high SECGP signal. In contrast, during standby of the memory, and for inactive memory sections, the SECLTP and CKELT are at logic low, and the FLOAT signal is at logic low as well. The NOR logic 610 provides a logic high to the node 614. The NOR logic 620 provides a logic low TMF signal and the inverter 630 provides a logic low SECGP signal as a result. When applied to the driver circuit 510 and standby PH circuit 520 of FIG. 5, for example, the transistor 516 is not conductive and the transistor 522 is conductive, thereby resulting in a PH signal having a VCC voltage.

Figure 7:
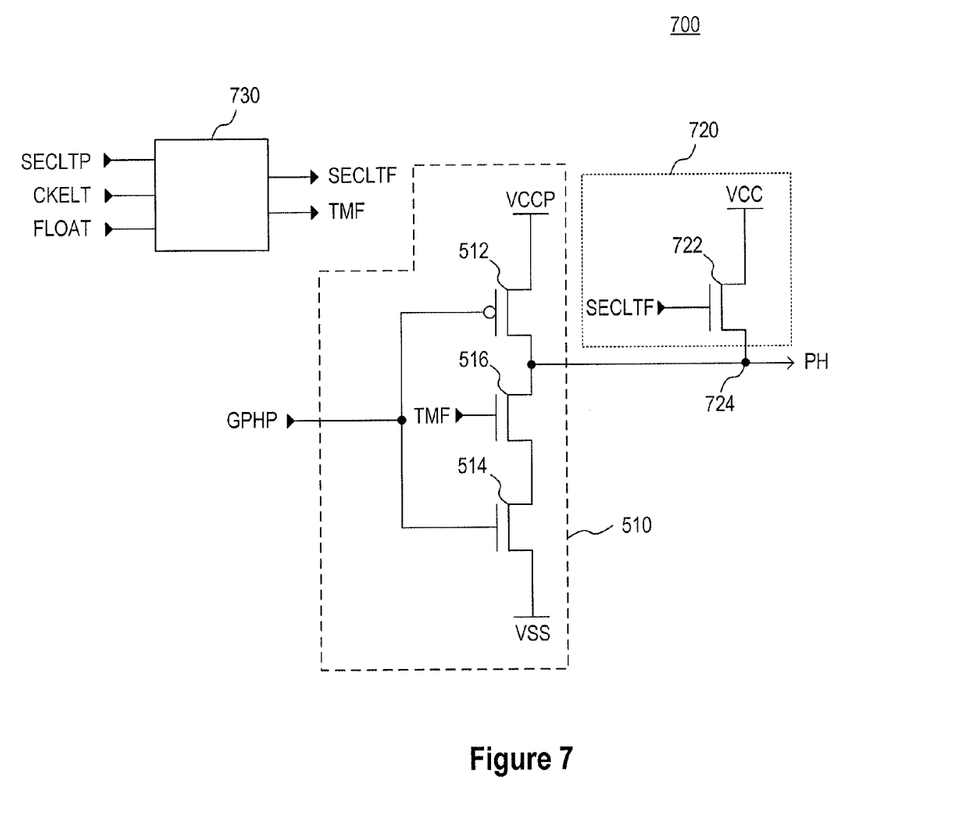
FIG. 7 is a schematic and block diagram of an apparatus according to an embodiment of the invention.

FIG. 7 illustrates an apparatus 700 according to an embodiment of the invention. The apparatus 700 includes a driver circuit 510, a standby PH circuit 720, and control logic 730. The driver circuit 510 is similar to the driver circuit 510 of the apparatus 500 of FIG. 5, and elements previously described are referenced using common reference numbers. As such, a detailed description of the driver circuit 510 will be not be repeated for FIG. 7 in the interest of brevity. The standby PH circuit 720 includes a transistor 722 coupled to node 724 and configured to receive a second supply voltage. In FIG. 7, the second supply voltage is provided by a second power supply providing a supply voltage VCC. A gate of transistor 722 is configured to receive a control signal SECLTF. The transistor 722 is configured to selectively couple the second supply voltage to the node 724 as controlled by the SECLTF signal. The transistor 722 is illustrated in FIG. 7 as an nFET. In other embodiments, the standby PH circuit 720 may include other circuits for coupling the second supply voltage to the node 724. The control logic 730 is configured to receive various control signals SECLTP, CKELT, and FLOAT, and provide the SECLTF and TMF signal responsive to the control signals. The SECLTP signal is indicative of an active/inactive state of a memory section to which the PH signal is provided. The CKELT signal is indicative of an active/standby mode of the memory. The FLOAT signal is typically at a logic low when power is provided to the device in which the apparatus 700 is included.

In operation, during an active mode of the memory, and for an active memory section, the SECLTP and CKELT signals are at logic high, and the FLOAT signal is at logic low. The control logic 730 provides the SECLTF having a logic low and provides the TMF signal having logic high. As a result, the transistor 722 is not conductive and the transistor 516 is conductive. The PH signal will have a voltage based on the logic level of the GPHP signal. That is, the PH signal will be at VCCP responsive to a logic low GPHP signal and the PH signal will be at ground responsive to a logic high GPHP signal. In contrast to an active mode, during standby mode of the memory, and for inactive memory sections, the SECLTP and CKELT are at logic low, and the FLOAT signal is at logic low as well. The control logic 730 provides the SECLTF having a logic high level and provides the TMF signal having logic low level. The GPHP signal is at logic high during the standby mode and inactive state, thereby controlling the transistor 512 to not be conductive. As a result, although the transistor 514 is conductive, the node 724 is decoupled from VCCP and ground. The node 724, however, is coupled through the transistor 722 to VCC, thereby providing a PH signal having a VCC voltage.

Figure 8:
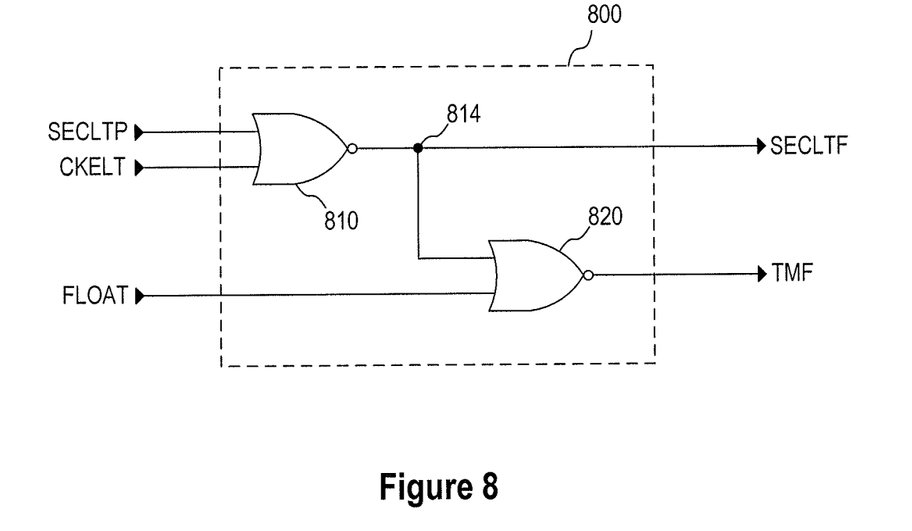
FIG. 8 is a schematic diagram of control logic according to an embodiment of the invention.

FIG. 8 illustrates control logic 800 according to an embodiment of the invention. The control logic 800 may be used for the control logic 730 of FIG. 7 to provide the SECLTF and TMF signals. The control logic 800 includes NOR logic 810 and 820. In operation, during an active mode of the memory, and for an active memory section, the SECLTP and CKELT signals are at logic high, and the FLOAT signal is at logic low. The NOR logic 810 provides a logic low to node 814. Similarly, the NOR logic 810 provides a logic low to the node 814 during an active mode of the memory for inactive memory sections (i.e., CKELT is at logic high and SECLTP is at logic low). As a result, the NOR logic 820 provides a logic high TMF signal and logic low provided to the node 814 is provided as the SECLTF signal. In contrast, during standby of the memory, and for inactive memory sections, the SECLTP and CKELT are at logic low, and the FLOAT signal is at logic low as well. The NOR logic 810 provides a logic high level to the node 814. The NOR logic 820 provides a logic low TMF signal and the logic high provided to the node 814 is provided as the SECLTF signal. When applied to the driver circuit 510 and standby PH circuit 720 of FIG. 7, for example, the transistor 516 is not conductive and the transistor 722 is conductive, thereby resulting in a PH signal having a VCC voltage.

Figure 9:
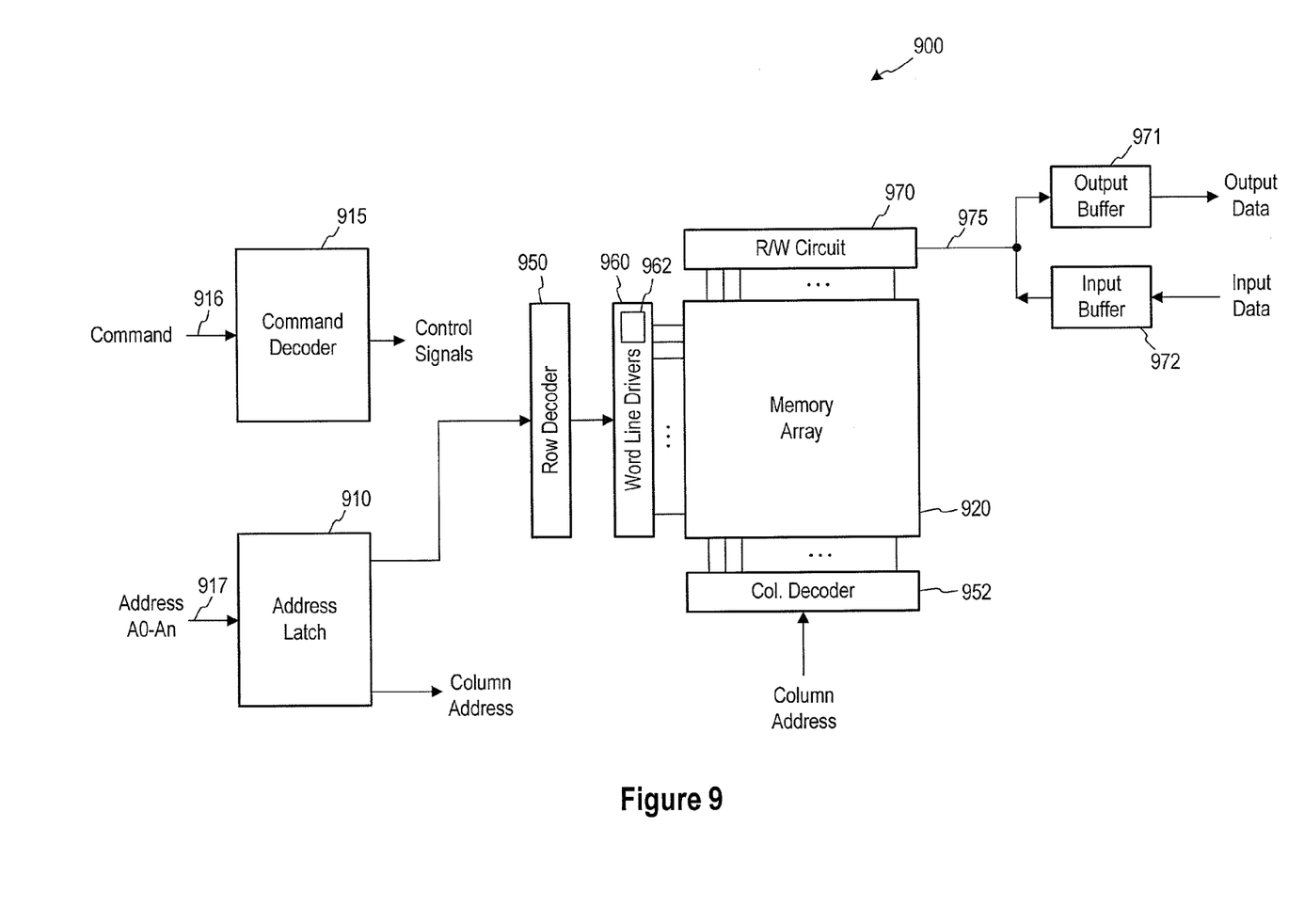
FIG. 9 is a block diagram of a memory including a voltage driver according to an embodiment of the invention.

FIG. 9 illustrates a portion of an apparatus in the form of a memory 900 according to an embodiment of the invention. The memory 900 includes a memory array 920 of memory cells. The memory cells of memory array 920 may be DRAM memory cells. In other embodiments, memory cells may be SRAM memory cells, flash memory cells, or other types of memory cells known by those having ordinary skill in the art. The memory 900 may be used in another apparatus, such as a computing system.

The memory 900 may receive commands at a command decoder 915 via command bus 916 and generate corresponding control signals. For example, the command decoder 915 is used to generate internal control signals to read data from and write data to the memory array 920. Row and column address signals may be provided to the address latch 910 via an address bus 917, which subsequently may output row and column addresses to the row address decoder 950 and the column address decoder 952.

The row address decoder 950 is coupled to word line driver 960, which may activate respective rows of memory cells in the array 920 corresponding to received row addresses. The row address decoder 950 may provide word line driver 960 with decoded row address signals. Word line driver 960 may in turn be configured to activate respective rows of memory cells in the array 920 corresponding to the decoded address signals. The word line driver 960 may include one or more voltage drivers according to an embodiment of the invention, for example, voltage drivers of FIGS. 3, 5, and/or 7. The column address decoder 952 selects bit lines extending through the array 920 corresponding to respective column addresses. The selected data line (e.g., a bit line or bit lines) corresponding to a received column address are coupled to a read/write circuitry 970 to provide read data to a data output buffer 971 via an input-output data bus 975. Write data is applied to the memory array 920 through a data input buffer 972 and the memory array read/write circuitry 970.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a control logic configured to provide a control signal indicative of a standby mode, wherein the control logic includes a logic configured to receive a first signal indicative of the standby mode and further receive a second signal indicative of activation of a memory section, the logic further configured to provide a logic output signal based at least in part on the first and second signals;
   a driver circuit coupled to the control logic and having an input and an output, wherein the driver circuit is configured to provide an output signal to a source of a transistor of a word line driver having a first voltage responsive to an input signal provided to the input; and
   a standby voltage circuit coupled to the output of the driver circuit and coupled to the control logic, wherein the standby voltage circuit is configured to increase a voltage of the output of the driver circuit to a second voltage during the standby mode and in an inactive state for the memory section responsive at least in part on the control signal indicating the standby mode, wherein the second voltage is non-zero and less than the first voltage.

2. The apparatus of claim 1 wherein the second voltage is a supply voltage and the first voltage is a pumped supply voltage.

3. The apparatus of claim 1 wherein the standby voltage circuit comprises a transistor configured to be conductive responsive at least in part on the control signal.

4. The apparatus of claim 3 wherein the transistor comprises a pFET.

5. The apparatus of claim 4 wherein the control logic comprises:
   an inverter coupled to the NOR logic and configured to invert the NOR logic output signal to provide the control signal.

6. The apparatus of claim 3 wherein the transistor comprises an nFET.

7. The apparatus of claim 1, further comprising a level shifter coupled to the driver circuit and configured to provide the input signal to the driver circuit having the first voltage responsive to an level shifter input signal having a third voltage, wherein the third voltage is less than the first voltage.

8. The apparatus of claim 7 wherein the third voltage is a supply voltage and the first voltage is a pumped supply voltage.

9. An apparatus, comprising:
   a signal driver configured to provide a word line voltage, wherein the word line voltage is a pumped supply voltage responsive to an active mode and the word line voltage is a non-zero voltage less than the pumped supply voltage during a standby mode, the signal driver further configured to provide the non-zero voltage during the standby mode and in an inactive state for a memory section; and
   a word line driver coupled to the signal driver and configured to provide the word line voltage from the signal driver to a respective word line during the active and standby modes.

10. The apparatus of claim 9 wherein the word line driver comprises first and second series coupled transistors, the first transistor configured to receive the word line voltage from the signal driver and the second transistor configured to receive a deactivated word line voltage.

11. The apparatus of claim 9 wherein the signal driver comprises:
    a driver circuit having an output and configured to provide the word line voltage at the output; and
    a standby voltage circuit coupled to the output of the driver circuit and configured to couple the output of the driver circuit to the non-zero voltage during the standby mode.

12. The apparatus of claim 11 wherein the driver circuit comprises:
    a first transistor configured to couple the output to a pumped voltage during the active mode responsive at least in part to an input signal;
    a second transistor coupled in series with a third transistor, the second transistor configured to be conductive responsive at least in part to power being provided to the apparatus and the third transistor configured to couple the output to a reference voltage during the active mode responsive at least in part to the input signal.

13. The apparatus of claim 12 wherein the first transistor comprises a pFET, and the second and third transistors comprise nFETs.

14. A method, comprising:
    providing a first voltage to a word line driver during an active mode for driving a word line with the first voltage; and
    providing a second voltage to the word line driver during a standby mode and in an inactive state of the memory section for driving the word line, wherein the second voltage is a non-zero voltage that is less than the first voltage.

15. The method of claim 14 wherein the second voltage is a supply voltage and the first voltage is a pumped supply voltage.

16. The method of claim 14, further comprising driving the word line during the active mode.

17. The method of claim 14 wherein providing the second voltage to the word line driver comprises coupling the word line driver to a voltage supply providing the second voltage during the standby mode.

18. The method of claim 17 wherein coupling the word line driver to a voltage supply comprises coupling an output of the word line driver responsive to a logic low signal.

19. A method, comprising:
   entering a standby mode for a memory; and
   decreasing a gate-to-source voltage for a transistor of a word line driver during the standby mode for the memory and in an inactive state for a memory section in the memory by increasing a word line voltage provided to a source of a transistor of the word line driver from a first voltage to a second voltage, wherein the first voltage less than the second voltage and wherein the second voltage is a non-zero voltage that is less than a voltage provided to a gate of the transistor during the standby mode.

20. The method of claim 19 wherein the voltage provided to the gate of the transistor comprises a pumped supply voltage and the word line voltage provided during standby comprises a supply voltage.

21. The method of claim 19, further comprising generating a signal indicative of a standby mode responsive to entering the standby mode, and responsive at least in part to the signal coupling the source of the transistor to a voltage supply providing a non-zero voltage that is less than a voltage provided to the gate of the transistor.

22. The method of claim 19, further comprising providing a ground voltage to the word line driver during an active mode for the memory.

* * * * *